United States Patent
Kuo et al.

(10) Patent No.: US 8,116,717 B2
(45) Date of Patent: *Feb. 14, 2012

(54) SELF-CALIBRATING DIRECT CONVERSION TRANSMITTER WITH CONVERTING/STEERING DEVICE

(75) Inventors: Bing-jye Kuo, Taipei (TW); Chinq-shiun Chiu, Hsinchu (TW)

(73) Assignee: MEDIATEK Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/861,858

(22) Filed: Aug. 24, 2010

(65) Prior Publication Data

US 2010/0317303 A1    Dec. 16, 2010

Related U.S. Application Data

(63) Continuation of application No. 11/467,831, filed on Aug. 28, 2006, now Pat. No. 7,881,681.

(51) Int. Cl.
*H04B 1/26* (2006.01)

(52) U.S. Cl. .................... 455/313; 455/323; 455/333

(58) Field of Classification Search ............... 455/313, 455/323, 333

See application file for complete search history.

(56) References Cited

U.S. PATENT DOCUMENTS

| | | | |
|---|---|---|---|
| 4,717,894 A | 1/1988 | Edwards et al. | |
| 5,196,742 A | 3/1993 | McDonald | |
| 5,355,534 A * | 10/1994 | Kimura | 455/323 |
| 5,764,700 A * | 6/1998 | Makinen | 375/272 |
| 5,867,778 A | 2/1999 | Khoury et al. | |
| 5,933,771 A | 8/1999 | Tiller et al. | |
| 6,014,043 A | 1/2000 | Nishida | |
| 6,212,369 B1 | 4/2001 | Avasarala | |
| 6,393,266 B1 * | 5/2002 | Molnar | 455/323 |
| 6,944,437 B2 * | 9/2005 | Yang et al. | 455/323 |
| 7,015,755 B2 | 3/2006 | Pettersson et al. | |
| 7,415,261 B2 | 8/2008 | Rosik et al. | |
| 7,521,981 B2 | 4/2009 | Ng et al. | |
| 7,587,187 B2 * | 9/2009 | Wyatt | 455/232.1 |
| 7,725,092 B2 | 5/2010 | Tsai et al. | |
| 2002/0164971 A1 * | 11/2002 | Weinholt et al. | 455/323 |
| 2003/0045249 A1 | 3/2003 | Nielsen | |
| 2003/0114129 A1 | 6/2003 | Jerng | |
| 2003/0169827 A1 | 9/2003 | Shi et al. | |
| 2003/0176177 A1 * | 9/2003 | Molnar et al. | 455/323 |
| 2003/0190900 A1 | 10/2003 | Yasuda et al. | |

(Continued)

FOREIGN PATENT DOCUMENTS

| | | |
|---|---|---|
| CN | 2591641 | 12/2003 |
| CN | 1805296 | 7/2006 |
| TW | I256781 | 6/2006 |

OTHER PUBLICATIONS

G. Brenna, D. Tschopp, and Q. Huang, "Carrier leakage suppression in direct-conversion WCDMA transmitters," in IEEE ISSCC Dig. Tech.Papers, San Francisco, CA, Feb. 2003, pp. 270-271.

G. Brenna, .etc, "A 2-GHz Carrier Leakage Calibrated Direct-Conversion WCDMA Transmitter in 0.13-_m CMOS" IEEE J. Solid-State Circuits, vol. 39, pp. 1253-1262, Aug. 2004.

*Primary Examiner* — Duc M Nguyen

(57) ABSTRACT

A steering and mixing module comprises a double balanced switch quad and a steering quad. The double balanced switch quad comprises a first output pair, and the first output pair is coupled to a first load stage. The steering quad comprises a second output pair, and the second output pair is coupled to a second load stage. The double balanced switch quad and the steering quad share an input pair.

12 Claims, 5 Drawing Sheets

U.S. PATENT DOCUMENTS

2004/0132424 A1 7/2004 Aytur et al.
2004/0252782 A1 12/2004 Demir et al.
2004/0252785 A1 12/2004 Demir et al.
2008/0315953 A1 12/2008 Beck

* cited by examiner

SELF-CALIBRATING DIRECT CONVERSION TRANSMITTER WITH CONVERTING/STEERING DEVICE

CROSS REFERENCE TO RELATED APPLICATION

The present application is a Continuation Application of U.S. patent application Ser. No. 11/467,831 now U.S. Pat. No. 7,881,681, which was filed on Aug. 28, 2006, and is incorporated by reference in its entirety.

TECHNICAL FIELD OF THE INVENTION

The present invention relates to a direct conversion transmitter (DCT), more particularly, to a steering and mixing module.

BACKGROUND OF THE INVENTION

Direct conversion transmitters are widely used in the field of wireless communication. In a direct conversion transmitter, baseband in-phase (I) and quadrature-phase (Q) signals are up-converted into radio frequency (RF) signals with a carrier provided by a local oscillator. Then the up-converted I signal and Q signal are then summed, amplified as an output signal and the output signal is transmitted via an antenna.

Carrier leakage caused by local oscillator error, baseband mismatch etc. is a concerned issue for the direct convention transmitter. To eliminate or reduce carrier leakage, a common solution is to detect an output of the direct conversion transmitter when no I and Q signals are input thereto, so as to obtain the leakage, and generate a compensation signal based on the detected leakage, led to reduce or even eliminate the leakage. The detection and compensation procedures can be repeated until the leakage is minimized.

For some applications, such as WCDMA, it is necessary to provide an RF variable gain amplifier (VGA) on a signal output path of the direct conversion transmitter to adjustably generate an output signal with a variable gain under a transmission condition. Further, under a calibration condition, before detecting the output signal for leakage upon no I and Q input signals fed into the transmitter, it is optimal to down-convert the leakage at radio frequency (RF) into a lowered frequency, such as an intermediate frequency (IF) or a baseband (BB) frequency for the convenience of process in the subsequent steps.

SUMMARY OF THE INVENTION

A first aspect of the present invention is to provide a steering and mixing module. The steering and mixing module comprises a double balanced switch quad and a steering quad. The double balanced switch quad and the steering quad share an output pair.

A second aspect of the present invention is to provide a steering and mixing module. The steering and mixing module comprises a double balanced switch quad and a steering quad. The double balanced switch quad comprises a first output pair, and the first output pair is coupled to a first load stage. The steering quad comprises a second output pair, and the second output pair is coupled to a second load stage. The double balanced switch quad and the steering quad share an input pair.

A third aspect of the present invention is to provide a steering and mixing module. The steering and mixing module comprises a double balanced switch quad and a steering quad. The steering quad is activated in a first mode, and the double balanced switch quad is activated in a second mode.

BRIEF DESCRIPTION OF THE DRAWINGS

The present invention will be further described in detail in conjunction with the accompanying drawings, wherein.

DETAILED DESCRIPTION OF THE INVENTION

Figure 1:
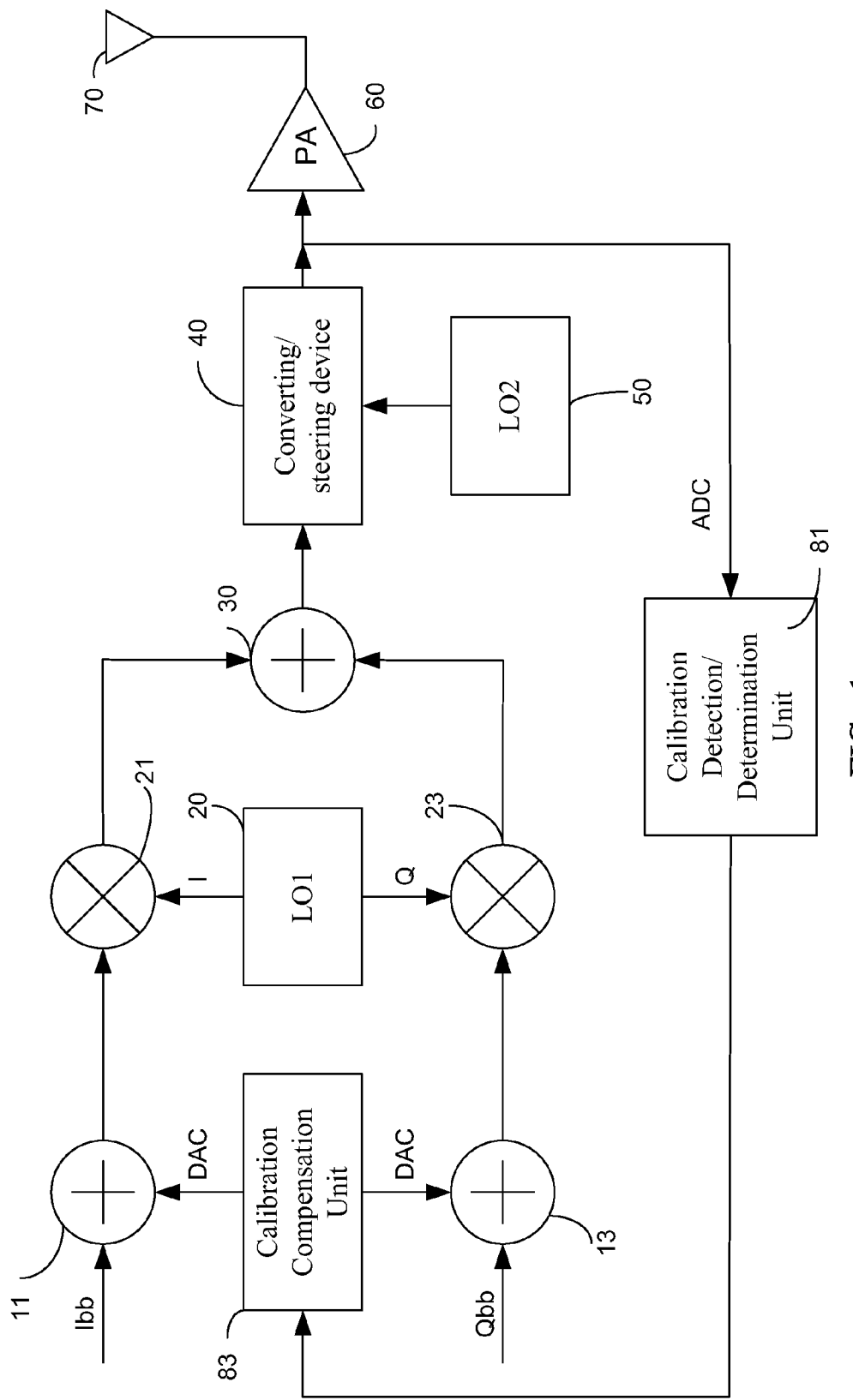
FIG. 1 is a block diagram schematically showing a direct conversion transmitter in accordance with the present invention.

FIG. 1 is a block diagram schematically showing a direct conversion transmitter in accordance with the present invention. FIG. 1 roughly illustrates only the essential elements for the sake of simplification and clarification.

When the direct conversion transmitter is under a transmission condition, an in-phase (I) baseband signal Ibb and a quadrature-phase (Q) baseband signal Qbb are up-converted into a radio frequency (RF) I and Q signals with an I component and Q component of a first local oscillator (LO) signal LO1 from an first local oscillator 20, respectively, by up-mixers 21 and 23. Then the RF I and Q signals are summed by a summing device 30 into a combined RF signal. The combined RF signal is adjusted with a variable gain by a converting/steering device 40 which is switched to a normal mode, and then is amplified by a power amplifier 60 and transmitted via an antenna 70.

When the direct conversion transmitter is under a calibration condition, no baseband signals Ibb and Qbb are input to the transmitter. A leakage signal, which may be generated due to the local oscillator 20 or other sources, is easy to be detected in this condition. The converting/steering device 40 is switched to a calibration mode and operates as a down-mixer to down-convert the leakage signal into a lowered frequency with a second local oscillator (LO) signal LO2 provided by a second local oscillator 50. It is noted that the first and second local oscillators 20, 50 can be combined as a single module in some applications. The LO signals LO1 and LO2 can be provided by any proper method. The down-converted leakage signal is then detected by a calibration detection/determination unit 81. Analog to digital conversion is preferably done after leakage-signal detection. The calibration detection/determination unit 81 determines and generates a compensation signal based on the detected leakage signal according to a calibration algorithm stored therein.

Any proper calibration algorithm can be used in the present invention, for example, a binary tree search algorithm is preferred, referring to "Carrier leakage suppression in direct-conversion WCDMA transmitters" G. Brenna, D. Tschopp, and Q. Huang, IEEE ISSCC Dig. Tech. Papers, pp. 270-271, San Francisco, Calif., February 2003; and "A 2-Ghz carrier leakage calibrated direct-conversion WCDMA transmitter in 0.13-_m CMOS", G. Brenna et al., IEEE J. Solid-State Circuit, vol. 39, pp. 1253-1262, August 2004.

The calibration detection/determination unit 81 provides a calibration compensation unit 83 with the compensation signal, and the compensation unit 83 feeds the compensation signal to summing devices 11 and 12, so that the compensation signal is incorporated into each of the input I and Q signals Ibb and Qbb by the summing devices 11, 12 in the transmission condition, so as to eliminate or reduce the leakage. Digital to analog conversion is done before the compensation signal is fed to the summing device 11 or 12.

The calibration detection/determination unit 81 and the calibration compensation unit 83 can be combined as a single calibration processing unit (not shown).

As mentioned above, the converting/steering device 40 has two modes including a normal mode and a calibration mode. In the normal mode, the converting/steering device 40 operates as a variable gain amplifier to adjust the output signal with a variable gain. In the calibration mode, the converting/steering device 40 operates as a down-mixer to down-convert the RF leakage signal to the lowered frequency.

Figure 2:
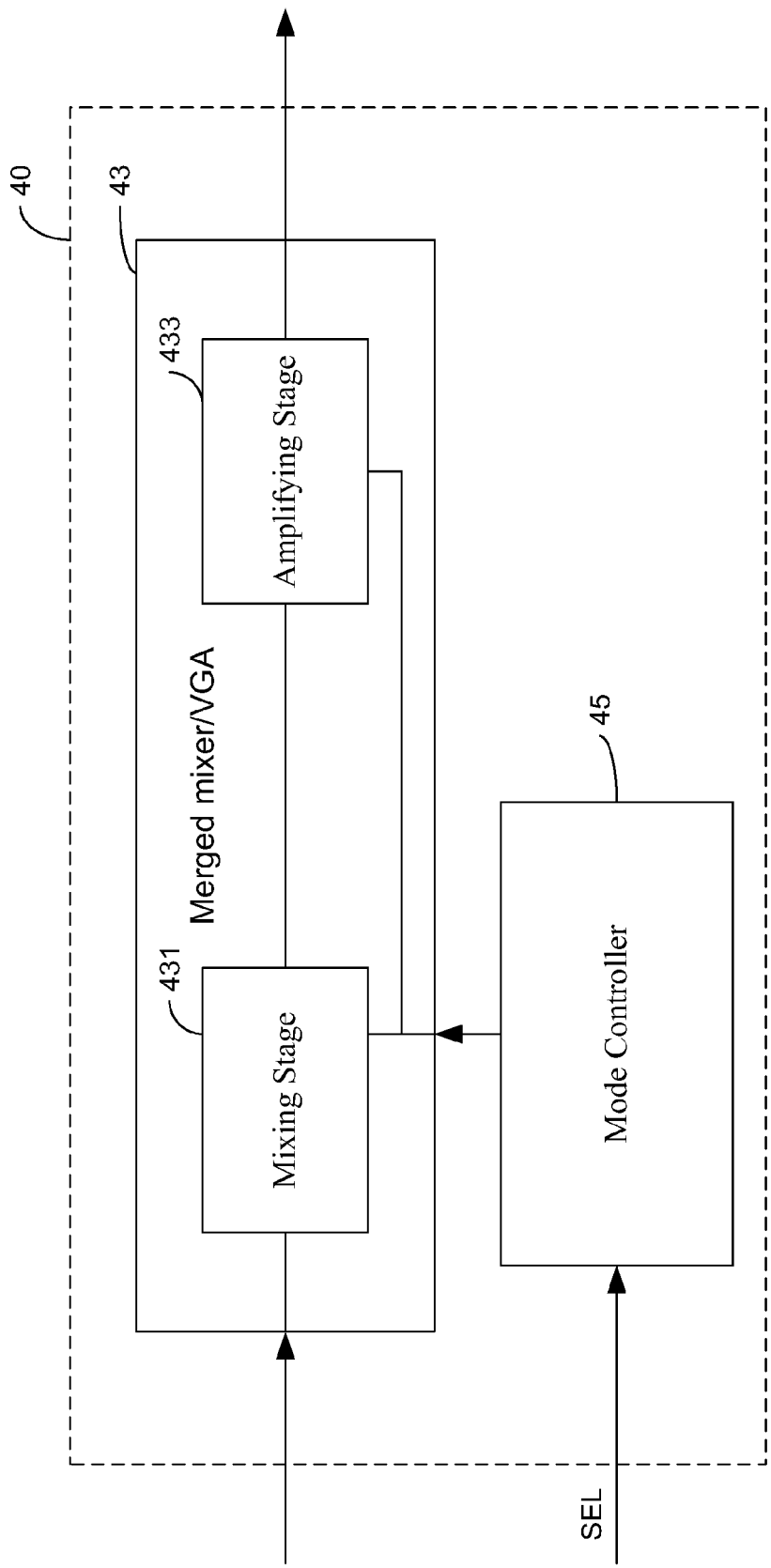
FIG. 2 is a block diagram schematically showing the converting/steering device in FIG. 1.

FIG. 2 is a block diagram schematically showing the converting/steering device 40. As shown in this drawing, the converting/steering device 40 preferably comprises a steering and mixing module, which is implemented by a merged mixer/variable gain amplifier (VGA) 43. In addition, the device 40 also has a mode controller 45. The merged mixer/VGA 43 has a mixing stage 431 and an amplifying stage 433 (detailed later). The mode controller 45 receives a mode selection signal SEL and switches the merged mixer/VGA 43 to be in one of the normal mode and calibration mode.

In a preferred embodiment, when the DCT is under the transmission condition, the mode controller 45 controls DC biases of the merged mixer/VGA 43 to switch the merged mixer/VGA 43 into the normal mode, and blocks the second local oscillator signal LO2 generated by the second local oscillator 50 from entering into the merged mixer/VGA 43, so that the amplifying stage 433 operates as an RF VGA, while the mixing stage 431 does not work.

When the DCT is under the calibration condition, the mode controller 45 controls DC biases of the merged mixer/VGA 43 to switch the merged mixer/VGA 43 into the calibration mode, and allows the second local oscillator (LO) signal LO2 generated by the second local oscillator 50 to enter into the merged mixer/VGA 43, so that the mixing stage 431 operates as a down-mixer, while the amplifying stage 433 can be deactivated or operate as an amplifier to amplify the down-converted leakage, so that it is easy to detect the amplified leakage. The details concerning this matter will be further described.

Figure 3:
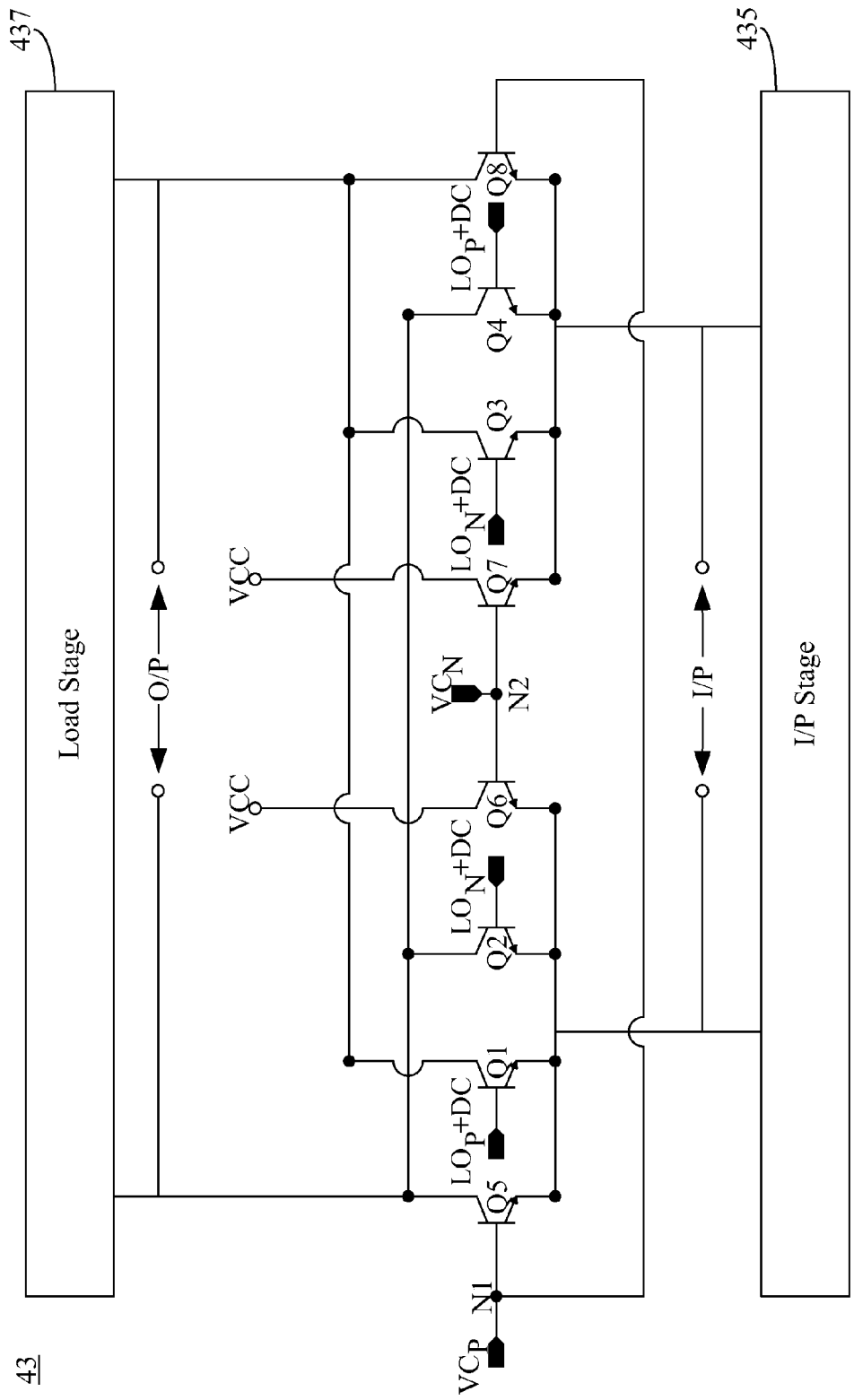
FIG. 3 is a schematic circuit diagram of a merged mixer/VGA in accordance with an embodiment of the present invention.
Figure 4:
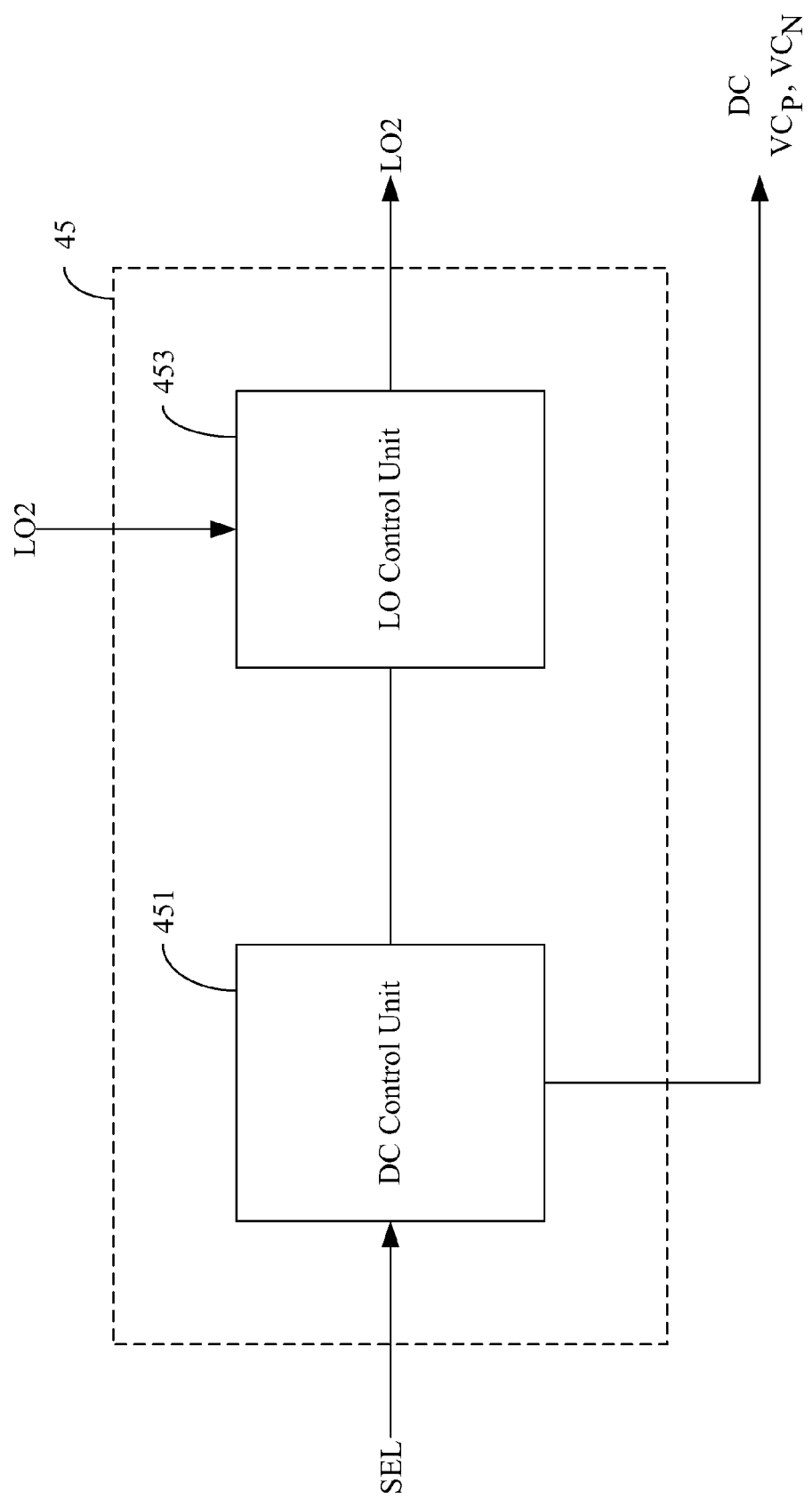
FIG. 4 is a block diagram schematically showing the mode controller in FIG. 2.

FIG. 3 illustrates a merged mixer/VGA 43 in accordance with an embodiment of the present invention. The merged mixer/VGA 43 of FIG. 3 includes the mixing stage 431 implemented by a double balanced switch quad having four transistors Q1, Q2, Q3 and Q4, which are connected to form a double balanced mixer, and the amplifying stage 433 implemented by a steering quad having four transistors Q5, Q6, Q7 and Q8, which are connected to form an RF VGA.

The bases of transistors Q1, Q2, Q3 and Q4 are LO/DC inputs. In the calibration mode, differential local oscillator components $LO_P$ and $LO_N$ of the local oscillator signal LO2, as well as differential components of a DC bias signal are fed into the mixing stage 431 via the LO/DC inputs, that is, the bases of transistors Q1, Q2, Q3 and Q4 as shown.

In the normal (transmission) mode, the DC bias signal is controlled to turn off the transistors Q1, Q2, Q3 and Q4. Accordingly, the mixing stage 431 does not operate. In addition, no LO signal components are fed to the bases of transistors Q1, Q2, Q3 and Q4.

The bases of transistors Q5 and Q8 are connected together at a node N1, and the bases of transistors Q6 and Q7 are connected together at a node N2. Control signals $VC_P$ and $VC_N$ are applied to the amplifying stage 433 from the nodes N1 and N2, respectively. The operation and gain of the amplifying stage 433 can be controlled by adjusting the control signals $VC_P$ and $VC_N$.

The emitters of transistors Q1, Q2, Q5 and Q6 are connected together as an input port, while the emitters of transistors Q3, Q4, Q7 and Q8 are connected together as another input port. The pair of input ports are connected to an input stage 435, which is known in this field, and the description thereof is omitted herein.

In the normal mode, a signal to be processed is input into the merged mixer/VGA 43 from the input ports, and is steered with a predetermined gain by the amplifying stage 433. In the calibration mode, a leakage is input into the merged mixer/VGA device 43 from the input ports, and is down-converted by the mixing stage 431 with the local oscillator components $LO_P$ and $LO_N$ of the second LO signal LO2.

The collectors of transistors Q1, Q3 and Q8 are connected together as an output port, and the collectors of transistors Q2, Q4 and Q5 are connected together as another output port. The gain-steered or down-converted signal is output from the pair of output ports. The output ports are connected to a load stage 437, which is formed by shunted resistors, for instance. The collectors of transistors Q6 and Q7 are connected to a power source VCC.

As mentioned above and shown in the FIG. 3, the amplifying stage 433 have the four transistors Q5, Q6, Q7 and Q8 connected as an RF VGA. The amplifying stage 433 including these four transistors Q5, Q6, Q7 and Q8 is referred to a single stage RF VGA circuit.

In another embodiment, an RF VGA circuit with two or more stages can be used. One stage of the RF VGA circuits is merged with the mixing stage 431 as illustrated in FIG. 3, while the other stage(s) is/are connected with the merged stage in a cascade form. It is noted that only the merged stage RF VGA is used as the amplifying stage 433 in accordance with the present invention, while the other stage(s) is/are used as normal RF VGA(s).

The controls of DC bias, LO and control signals are performed by the mode controller 45. The mode controller 45 receives a mode selection signal SEL indicating the operation condition of the direct conversion transmitter and selects either the normal (transmission) mode or calibration mode accordingly.

The mode controller 45 includes a DC control unit 451 and a LO control unit 453.

The DC bias signal for the mixing stage 431 and the control signals $VC_P$, $VC_N$ for the amplifying stage 433 are controlled by DC control unit 451 of the mode controller 45.

In the normal mode, the control signals $VC_P$ and $VC_N$ for the amplifying stage 433 are applied via a normal path other than the mode controller 45. The DC bias signals of the mixing stage 431 are controlled so that the current is forced to flow through the amplifying stage 433 rather than the mixing stage 431. For example, the DC control unit 451 may pull-down the level of the DC bias signal of the mixing stage 431 to zero so that transistors Q1, Q2, Q3 and Q4 are turned off. Alternatively, the level of DC bias of the mixing stage 431 can be dropped lower than the control signals $VC_P$, $VC_N$, whereby the current is forced to flow through the amplifying stage 433. In addition, the LO control unit 453 blocks the second LO signal LO2 generated by the second local oscillator 50, so that no LO signal enters into the mixing stage 431.

In the calibration mode, the DC control unit 451 of the mode controller 45 controls the level of the DC bias for the mixing stage 431 to be higher than the control signals $VC_P$, $VC_N$, so that the current is forced to flow through the mixing stage 431. It is preferred that the control signals $VC_P$, $VC_N$ are also controlled by the mode controller 45 in the calibration mode to ensure that a great portion or all of the current flow through the mixing stage 431. In this manner, the down-conversion function can be performed smoothly. Furthermore, the LO control unit 453, which receives the second LO signal LO2 from the second local oscillator 50, passes the second LO signal LO2 to the mixing stage 431, that is, the bases of transistors Q1, Q2, Q3 and Q4 in the calibration mode. Accordingly, the mixing stage 431 can mix the input signal fed through the input ports with the $LO_N$, $LO_P$, the differential components of the second LO signal LO2, to generate a down-converted output signal.

Figure 5:
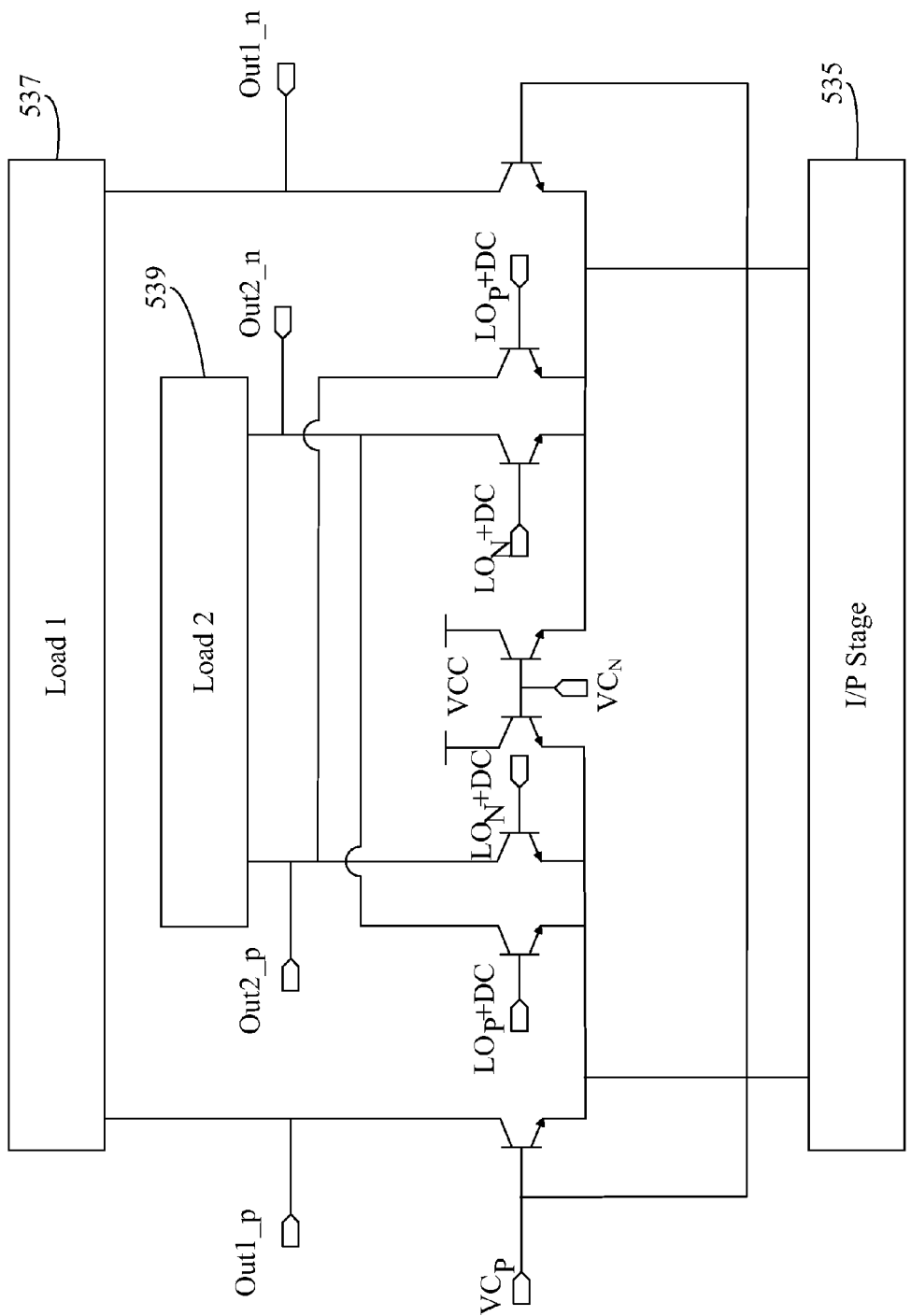
FIG. 5 is a schematic circuit diagram of a merged mixer/VGA in accordance with another embodiment of the present invention.

FIG. 5 illustrates a merged mixer/VGA 43' in accordance with another embodiment of the present invention. The structure of the merged mixer/VGA 43' is similar to that of the merged mixer VGA 43 in FIG. 3. A mixing stage of the merged mixer/VGA 43' comprises transistors Q1, Q2, Q3 and Q4 constituting a double balanced switch quad; and an amplifying stage thereof comprises transistors Q5, Q6, Q7 and Q8 constituting a steering quad. The pair of input ports of the merged mixer/VGA 43' are connected to an input stage 535. The pair of input ports of the merged mixer/VGA 43' are respective the connection of the emitters of transistors Q1, Q2, Q5 and Q6 and the connection of the emitters of transistors Q3, Q4, Q7 and Q8. As described, the mixer/VGA 43 in FIG. 3 has only one pair of output ports (the collectors of transistors Q1, Q3 Q8 and the collectors of transistors Q2, Q4, Q5) and the one pair of output ports are connected to the load stage 437. Different from the mixer/VGA 43, the mixer/VGA 43' has two pairs of output ports. A first pair of output ports Out1_p and Out1_n are respectively the collectors of transistors Q5 and Q8. A second pair of output ports Out2_p and Out2_n are respectively the collector connection of transistors Q2, Q4 and the collector connection of transistors Q1, Q3. In addition, the first pair of output ports are connected to a first load stage (Load 1) 537, while the second pair of output ports are connected to a second load stage (Load 2) 539.

In the embodiments of the present invention, the transistors Q1 to Q8 are implemented by bipolar junction transistors (BJTs). However, other types of transistors, such as CMOS, also can be used.

While the preferred embodiment of the present invention has been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A steering and mixing module, comprising:
a double balanced switch quad; and
a steering quad;
wherein the steering quad is activated when the steering and mixing module operates as a variable gain amplifier (VGA) in a first mode, and the double balanced switch quad is activated when the steering and mixing module operates as a mixer in a second mode.

2. The steering and mixing module as claimed in claim 1, wherein the double balanced switch quad and the steering quad share an output pair.

3. The steering and mixing module as claimed in claim 2, wherein the steering quad is deactivated in the second mode, and the double balanced switch quad is deactivated in the first mode.

4. The steering and mixing module as claimed in claim 2, wherein the double balanced switch quad comprises a first transistor, a second transistor, a third transistor and a fourth transistor, the first transistor and the third transistor each has an output terminal connected together as one output port of said output pair, and the second transistor and the fourth transistor each has an output terminal thereof connected together as another output port of said output pair.

5. The steering and mixing module as claimed in claim 4, wherein said transistors are bipolar junction transistors (BJTs), and said output terminal is collector terminal.

6. The steering and mixing module as claimed in claim 2, wherein the steering quad comprises a fifth transistor, a sixth transistor, a seventh transistor and an eighth transistor, and the fifth transistor and the eighth transistor have output terminals thereof serve as respective ports of said output pair.

7. The steering and mixing module as claimed in claim 6, wherein said transistors are bipolar junction transistors (BJTs), and the output terminals are collector terminals.

8. The steering and mixing module as claimed in claim 1, wherein the double balanced switch quad and the steering quad share an input pair.

9. The steering and mixing module as claimed in claim 8, wherein the double balanced switch quad comprises a first transistor, a second transistor, a third transistor and a fourth transistor, the first transistor and the second transistor have input terminals thereof connected together as one input port of said input pair, and the third transistor and the fourth transistor have input terminals thereof connected together as another input port of the input pair.

10. The steering and mixing module as claimed in claim 9, wherein said transistors are bipolar junction transistors (BJTs), and the input terminals are emitter terminals.

11. The steering and mixing module as claimed in claim 8, wherein the steering quad comprises a fifth transistor, a sixth transistor, a seventh transistor and an eighth transistor, the fifth transistor and the sixth transistor have input terminals thereof connected together as one input port of said input pair, the seventh transistor and the eighth transistor have input terminals thereof connected together as another input port of said input pair.

12. The steering and mixing module as claimed in claim 11, wherein said transistors are bipolar junction transistors (BJTs), and the input terminals are emitter terminals.

* * * * *